(12) United States Patent
Kim et al.

(10) Patent No.: US 11,765,976 B2
(45) Date of Patent: Sep. 19, 2023

(54) METHOD AND APPARATUS FOR PRODUCING POLYMERIC PIEZOELECTRIC COMPOSITE INCLUDING BORON NITRIDE NANOTUBES DISPERSED THEREIN, AND POLYMERIC PIEZOELECTRIC COMPOSITES PRODUCED USING THE METHOD

(71) Applicant: NAiEEL Technology, Daejeon (KR)

(72) Inventors: Jaewoo Kim, Daejeon (KR); Duckbong Seo, Daejeon (KR); Byunghoon Kim, Daejeon (KR); Junghwan Jung, Daejeon (KR); Inpil Kang, Busan (KR); Young-Soo Seo, Seoul (KR); Hoon Huh, Seoul (KR)

(73) Assignee: NAiEEL Technology, Daejeon (KR)

( * ) Notice: Subject to any disclaimer, the term of this patent is extended or adjusted under 35 U.S.C. 154(b) by 839 days.

(21) Appl. No.: 16/690,942

(22) Filed: Nov. 21, 2019

(65) Prior Publication Data
US 2020/0357979 A1    Nov. 12, 2020

(30) Foreign Application Priority Data
May 9, 2019    (KR) .................. 10-2019-0054469

(51) Int. Cl.
*C08K 3/38* (2006.01)
*H10N 30/092* (2023.01)
*C08J 3/21* (2006.01)
*H10N 30/85* (2023.01)
*H10N 30/00* (2023.01)

(52) U.S. Cl.
CPC .............. *H10N 30/092* (2023.02); *C08J 3/21* (2013.01); *C08K 3/38* (2013.01); *C08J 2327/16* (2013.01); *C08K 2003/385* (2013.01); *C08K 2201/011* (2013.01); *H10N 30/1051* (2023.02); *H10N 30/852* (2023.02)

(58) Field of Classification Search
CPC ..... H01L 41/37; H01L 41/183; H01L 41/193; C08K 3/38; C08K 2003/385; C08K 2201/011; C08K 9/00; C08J 3/212; C08L 27/16; D01D 5/003; B82Y 30/00
USPC ........................................................ 310/345
See application file for complete search history.

(56) References Cited

U.S. PATENT DOCUMENTS

| 2003/0089890 | A1  | 5/2003  | Niu et al. |
| 2015/0273817 | A1* | 10/2015 | Qi ............................ B41J 2/01 442/164 |
| 2016/0190427 | A1* | 6/2016  | Kim ...................... H01L 41/193 252/62.9 R |
| 2018/0215625 | A1* | 8/2018  | Zo .......................... C01B 21/064 |
| 2019/0284423 | A1* | 9/2019  | Bodkhe ................. H01L 41/193 |

FOREIGN PATENT DOCUMENTS

| CN | 105908490    | A  | 8/2016  |
| JP | 2010-275675  | A  | 12/2010 |
| JP | 2018-181508  | A  | 11/2018 |
| KR | 10-2012-0083261 | A | 7/2012 |
| KR | 10-2012-0095889 | A | 8/2012 |
| KR | 10-2014-0004619 | A | 1/2014 |
| KR | 10-1848057   | B1 | 4/2018  |
| KR | 10-2018-0053874 | B1 | 5/2018 |
| WO | 2015111755   | A1 | 7/2015  |
| WO | 2019084209   | A1 | 2/2019  |

OTHER PUBLICATIONS

Chenjie Fu, "Improving thermal conductivity of polymer composites by reducing interfacial thermal resistance between boron nitride nanotubes", Composites Science and Technology 165, 2018, pp. 322-330, www.elsevier.com/locate/compscitech.
International Search Report, Application No. PCT/KR2019/005766, dated Feb. 6, 2020, 4 pages.
Ozlem Sen, "Boron nitride nanotubes included thermally cross-linked gelatin-glucose scaffolds show improved properties", Colloids and Surfaces B: Biointerfaces, 2016, pp. 41-19, Elsevier B.V., http://dx.doi.org/10.1016/j.colsurfb.2015.11.036.
Office Action corresponding to Japanese Application No. 2020-545769 issued by the Japanese Patent Office dated Dec. 7, 2021, pp. 1-26.
Takeshi Terao et al., "Alignment of Boron Nitride Nanotubes in Polymeric Composite Films for Thermal Conductivity Improement", The Journal of Physical Chemistry C, Feb. 22, 2010, 6 pages, 2010 American Chemical Society.
Korean Office Action Report, Application No. 10-2019-0054469, dated Jul. 14, 2020, 5 pages.

* cited by examiner

*Primary Examiner* — Hannah J Pak
(74) *Attorney, Agent, or Firm* — Innovation Counsel LLP

(57) ABSTRACT

Proposed is a method for producing a polymeric piezoelectric composite having boron nitride nanotubes (BNNT) dispersed therein, the method including: a solution-providing step for providing a polymeric solution; a dispersing step for dispersing BNNT in the polymeric solution; and an electro spinning step for electro spinning the polymeric solution with BNNT dispersed therein, thereby producing micro- and/or nano fibers based polymeric piezoelectric composites.

1 Claim, 7 Drawing Sheets

METHOD AND APPARATUS FOR PRODUCING POLYMERIC PIEZOELECTRIC COMPOSITE INCLUDING BORON NITRIDE NANOTUBES DISPERSED THEREIN, AND POLYMERIC PIEZOELECTRIC COMPOSITES PRODUCED USING THE METHOD

CROSS-REFERENCE TO RELATED APPLICATION

This U.S. non-provisional patent application claims priority under 35 U.S.C. § 119 of Korean Patent Application No. 10-2019-0054469 filed on May 9, 2019, the content of which is hereby incorporated by reference in its entirety.

BACKGROUND

Technical Field

The present disclosure relates to a method and an apparatus for producing polymeric piezoelectric composites in which boron nitride nanotubes (BNNT) are dispersed, and polymeric piezoelectric composites produced by the method. More specifically, the present disclosure relates to a method and an apparatus for producing polymeric piezoelectric composites in which BNNT are dispersed, and polymeric piezoelectric composites produced by the method where, since the BNNT are aligned in the same direction with the micro- and/or nano fibers using electro spinning without an additional and costly aligning process for polarization, the polarization and piezoelectric properties of the polymeric piezoelectric composites can be improved.

Background Information

Boron nitride nanotubes (BNNT) have similar mechanical and thermal conductive properties as those of commonly known carbon nanotubes (CNT). However, during the production process, electric conducting CNT and semiconducting CNT are produced at the same time. The CNT are readily oxidized in air above 400° C. However, BNNT have electrical insulation property and thermal/chemical stability so that the BNNT are not oxidized even at a temperature of 800° C. or higher in air.

In a polymer composite in which BNNT are dispersed, the polymer composite is both electrically insulating and thermally conducting due to the high thermal conductivity and electrical insulating property of BNNT, and thus can be used as a very efficient electrical insulating and thermal conducting material.

In addition, BNNT have an excellent thermal neutron absorption capability and thus are very applicable to the nuclear/space industry. In particular, in an aluminum composite in which BNNT are dispersed, the mechanical strength thereof is known to be similar to that of stainless steel, but the density thereof is only half of stainless steel. Thus, BNNT dispersed aluminum composite may be used as a light weight and high strength metal alloy and also has a radiation shielding property due to its excellent thermal neutron absorption capability.

More importantly, BNNT are known to have piezoelectricity due to the different electric potential caused by the asymmetry of the crystal structure and structural defects, and by the external pressure or vibration applied to BNNT. In these regards, BNNT are very attractive as an advanced and promising piezoelectric material. While ceramic PZT (lead zirconatetitanate, $Pb(Zr,Ti)O_3$), which is a widely used piezoelectric material, has high piezoelectricity and economic reliability, it is very heavy and toxic due to lead contained in the material, and is not flexible and is vulnerable to impact. Thus, ceramic PZT is limited in its industrial applications, and, in particular, is not applicable to wearable sensors/robots and medical and environmental applications due to its toxicity and rigidity. Furthermore, a poling process for the polarization of ceramic PZT is also required in order to achieve the piezoelectric property.

However, a polymeric piezoelectric composite that BNNT are dispersed and aligned in the polymer matrix is not biologically toxic (non-cytotoxic), and can be made as large, flexible, impact- and moisture-resistant sheets. Thus, BNNT-aligned polymeric piezoelectric composites can be used as an advanced and efficient environmentally friendly piezoelectric material.

As methods for BNNT synthesis, arc-discharge, laser-plasma, CVD, and ball milling-heat treatment methods etc. have been developed over the last several decades, while the laser-plasma and ball milling-heat treatment methods are currently available as commercial processes. These methods have been improved based on the types of reaction gases, forms of precursors, characteristics of the production apparatus, and energy consumption, etc. It is known that BNNT are very difficult to be synthesized, mainly because the operating temperature is very high, from 1200° C. to even 5000° C., and thus mass production is currently immature, while CNT can be readily synthesized at moderate temperature of about 800° C. For BNNT, furthermore, impurities due to the precursor elements and reaction gases are also generated which lowers its purity.

Therefore, a need for technologies and systems for BNNT production capable of overcoming the disadvantages described above for producing a large amount of high-purity BNNT is growing. In addition, R&D for industrial applications for BNNT is also extremely important.

For a piezoelectric application of BNNT, according to recent researches, an electrical or mechanical polarization process can be performed to improve the piezoelectric properties of BNNT dispersed polymer composite materials. However, it is extremely difficult to carry out the electromagnetic poling process for BNNT due to its electrical insulating property. In addition, extremely high voltage should be applied to BNNT for this type of electrical polarization process to align the nanotubes in the uniform direction. Also, the dispersion process using mechanical shear force to align BNNT in the polymer matrix is also tried, while it is not effective to improve the piezoelectricity of the composites. As a result, the polarization processes based on above-mentioned aligning methods are restricted in that it needs very high voltage, takes a long operating time, and require high cost to perform the repetitive mechanical treatment.

The polarization process to improve the piezoelectricity of the BNNT dispersed polymer composite basically requires the alignment of the nanotubes inside the composites. This alignment process may greatly improve the piezoelectric performance of those polymer composites.

Therefore, it is important to develop a method for producing BNNT dispersed and aligned polymeric piezoelectric composites, in which the piezoelectric characteristics of the composites can be maximized by aligning and/or polarizing BNNT without performing an expensive polarization process.

The related prior art includes Korean Patent No. 10-1867905 "Boron nitride nanotube production apparatus and method, and boron nitride nanotube produced using the same" (Issue date: Jun. 8, 2018).

SUMMARY

One purpose of one embodiment of the present disclosure is to provide a method and an apparatus for producing polymeric piezoelectric composites in which BNNT are dispersed, and polymeric piezoelectric composites produced by the method where, since BNNT may be aligned in the same direction as the orientation of polymer micro- and/or nano fibers produced based on electro spinning, which is a simple, useful and cheap polymer sheet manufacturing process, and may maximize the piezoelectric effect by aligning BNNT.

Furthermore, another purpose of one embodiment of the present disclosure is to provide a method and an apparatus for producing polymeric piezoelectric composites in which BNNT are dispersed, and polymeric piezoelectric composites produced by the method where, since those fibers are produced by the electro spinning process, BNNT can be aligned in the same direction as the orientation of those fibers upon electro spinning operation, and furthermore, the polarization of the polymer itself can also be achieved depending on the types of polymer, such that the polarization effect of the polymer composites can be maximized.

Furthermore, still another purpose of one embodiment of the present disclosure is to provide a method and an apparatus for producing polymeric piezoelectric composites in which BNNT are dispersed, and polymeric piezoelectric composites produced by the method, where the piezoelectric characteristics of the composites can be improved.

Furthermore, yet still another purpose of one embodiment of the present disclosure is to provide a method and an apparatus for producing polymeric piezoelectric composites in which BNNT are dispersed, and polymeric piezoelectric composites produced by the method, where BNNT are aligned in a uniform direction inside the polymer micro- and/or nano fibers such that the piezoelectric effect can be maximized, and furthermore, the piezoelectric effect can be further maximized due to the polarization effect of the polymer itself.

Furthermore, yet still another purpose of one embodiment of the present disclosure is to provide polymeric piezoelectric composites produced by dispersing and aligning the BNNT in the polymer composites such that the polymeric piezoelectric composites can be flexible and have a high piezoelectric coefficient.

The purpose of the present disclosure is not limited to the above-mentioned purpose(s), and other purpose(s) not mentioned may be clearly understood by those skilled in the art from the descriptions below.

In one aspect, there is a proposed method producing polymeric piezoelectric composites having BNNT dispersed therein, the method including the steps of providing a polymeric solution; dispersing the BNNT in the polymeric solution; and electro spinning the polymeric solution with BNNT dispersed therein to produce micro- and/or nano fibers polymeric piezoelectric composites.

In one embodiment, the step of electro spinning is performed such that BNNT are dispersed in the polymeric solution at a concentration of 0.01 wt % to 20 wt %.

In one embodiment, the step of electro spinning is performed such that BNNT are dispersed in the polymeric solution at a concentration of 2 wt %.

In one embodiment, the step of electro spinning is performed such that a voltage applied to the polymeric solution is in a range of 5 kV to 30 kV.

In one embodiment, the polymeric solution prepared in the step of preparing the solution is a solution in which polyvinylidene fluoride (PVDF) as a polymer is dissolved in DMA and acetone solution at 10 wt % to 30 wt % with respect to a weight of the solution.

In one embodiment, the dispersing step is performed such that BNNT are homogeneously dispersed in the polymeric solution using ultrasonic vibrational excitation.

In one embodiment, the dispersing step is performed such that BNNT are homogeneously dispersed in the polymeric solution based on mechanical turbulence using a stirrer or mixer.

In one embodiment, the dispersing step is performed such that BNNT are surface-treated to be homogeneously dispersed in the polymeric solution. In this case, the adhesion strength between BNNT and the polymer resin can be improved.

In one embodiment, the step of electro spinning is performed such that the polymeric solution is spun to align BNNT in the same direction as direction of those fibers to form polymer-BNNT composite films.

In one embodiment, an ejection rate of the polymeric solution is in a range of 15 µL/min to 70 µL/min, and a distance between a collector on which the polymer film is formed and an ejector from which the polymeric solution is electro spun is in a range of 5 cm to 20 cm.

In another aspect, there is a proposed apparatus for producing a polymeric piezoelectric composite having BNNT dispersed therein, the apparatus including: a solution supplier for storing and supplying a polymeric solution having BNNT dispersed therein; a solution ejector for ejecting the polymeric solution supplied from the solution supplier; a collector on which the polymeric solution ejected from the solution ejector is collected as a micro- and/or nano fibers polymeric piezoelectric composite; and a high-voltage power supplier for applying a high voltage to the solution ejector and the collector such that the polymeric solution is collected on the collector using electro spinning, in which the polymeric solution is electro spun from the solution ejector to the collector using electro spinning to align the BNNT in the same direction.

In one embodiment, BNNT are dispersed in the polymeric solution at a concentration of 2 wt %.

In one embodiment, the solution supplier is a syringe type in which the solution ejector is a needle type coupled to a tip of the solution supplier, and the collector is a rotatable drum type.

In one embodiment, when the high voltage is applied to the solution ejected from the ejector, the polymeric solution is formed into a hemispherical shape at a tip of the solution ejector due to surface tension, and then the hemispherical shape is converted into a Taylor Cone due to mutual electrostatic repulsion between surface charges and external electric field, and when electric field of predetermined or greater intensity is applied, the polymeric solution is electro spun toward the collector to form micro- and/or nano fibers polymeric piezoelectric composite sheet on the collector.

In one embodiment, a voltage applied to the polymeric solution from the high-voltage power supplier is in a range of 5 kV to 30 kV, an ejection rate of the polymeric solution is in a range of 15 µL/min to 70 µL/min, a distance between the collector on which the polymer film is formed and the ejector from which the polymeric solution is electro spun is in a range of 5 cm to 20 cm, and a shape of the micro- and/or nano fibers is selectively determined by adjusting the applied voltage, the ejection rate, and/or the distance.

In another aspect, there is a proposed polymeric piezoelectric composite having BNNT dispersed therein, the polymeric piezoelectric composite is produced by dispersing BNNT in a polymeric solution including a polymer dissolved therein, and by electro spinning the polymeric solution with BNNT dispersed therein to form micro- and/or nano fibers, and BNNT are well-aligned in a longitudinal direction of those fibers.

In accordance with one embodiment of the present disclosure, since BNNT may be aligned in the same direction with and inside the polymer fibers using electro spinning without an additional costly aligning process for polarization of BNNT, the piezoelectric properties of the polymeric composites can be improved.

Furthermore, in accordance with one embodiment of the present disclosure, since those fibers are produced by the electromagnetic field generated during the electro spinning process, BNNT can be aligned in the same direction with and inside of those fibers upon the spinning operation, and furthermore, the polarization of the polymer itself can be also achieved depending on the kind of polymer, such that the polarization effect of the polymer composites can be maximized.

Furthermore, in accordance with one embodiment of the present disclosure, the piezoelectric characteristic of the composites can be improved.

Furthermore, in accordance with one embodiment of the present disclosure, BNNT are well-aligned in uniform direction with those polymer fibers such that the piezoelectric effect is maximized. Furthermore, the piezoelectric effect is further maximized due to the polarization (rearrangement) effect of constituent elements of the polymer itself.

Furthermore, in accordance with one embodiment of the present disclosure, when BNNT are aligned with the same direction with and inside of those polymer fibers, the elastic modulus of the polymer composite can be increased. As a result, the mechanical stress by the applied pressure increases local deformation of the polymer composites. This improves the piezoelectric property of the polymer composites in which BNNT are dispersed. And, in the polymer composites in which BNNT are aligned during the electro spinning process, the polarization property of the pure polymer can be further improved in addition to polarization effect of BNNT. In this way, the integration of BNNT can maximize the polarization characteristic and thus the piezoelectric characteristic can be further improved.

Ultimately, according to an embodiment of the present disclosure, the polymeric piezoelectric composites can be produced by dispersing and aligning BNNT in the polymer composites such that the polymeric piezoelectric composites can be flexible and have high piezoelectric coefficients.

DESCRIPTION OF MAIN REFERENCE NUMERALS OF DRAWINGS

Figure 1:
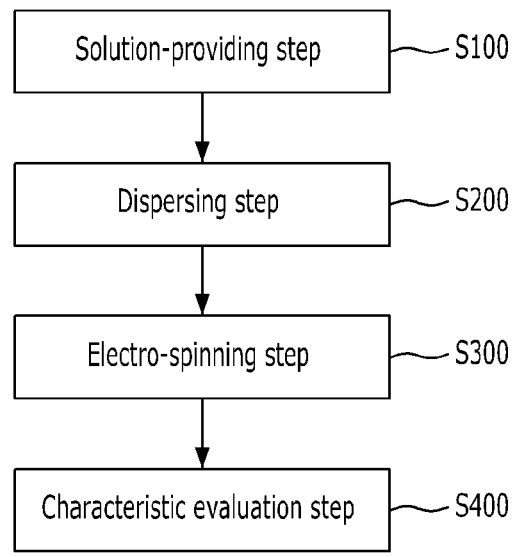
FIG. 1 is a flow chart of a method for producing polymeric piezoelectric composites with BNNT dispersed therein using electro spinning according to one embodiment of the present disclosure.

100: Production apparatus of polymeric piezoelectric composites in which BNNT are dispersed
110: Solution supplier
111: Polymeric solution
120: Solution ejector
130: High-voltage power supplier
140: Collector
150: Polymeric piezoelectric composite of nano fiber phase
S100: Solution-providing step
S200: Dispersing step
S300: Electro spinning step
S400: Characteristics evaluation step

DETAILED DESCRIPTION

The advantages and/or features of the present disclosure, and method for achieving the same, will become apparent by reference to the embodiments detailed below in conjunction with the accompanying drawings. However, the present disclosure is not limited to the embodiments as disclosed below, but may be embodied in many different forms. These embodiments are provided to merely allow the present disclosure to be complete and to fully illustrate the scope of the invention to those skilled in the art to which the present disclosure pertains. The present disclosure is only defined by the scope of the claims. Like reference numerals refer to like elements throughout the specification.

Hereinafter, embodiments of the present disclosure will be described in detail with reference to the accompanying drawings.

Figure 2:
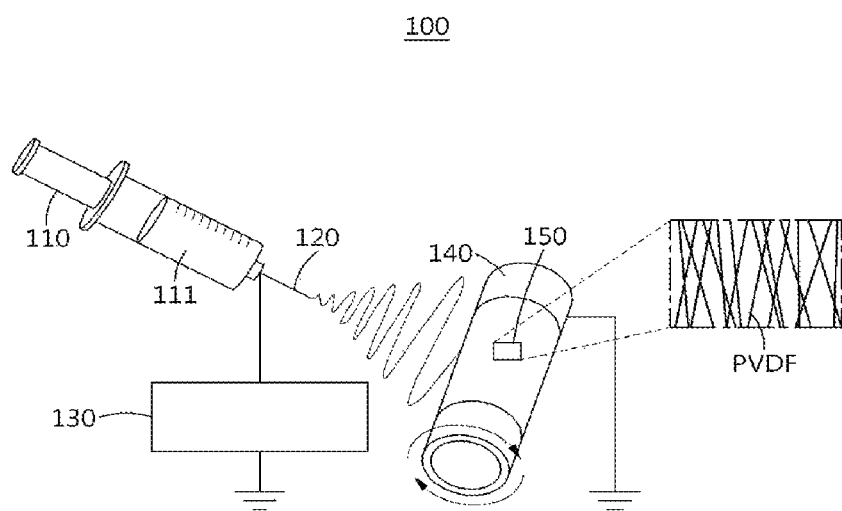
FIG. 2 is a schematic diagram of a production apparatus for polymeric piezoelectric composites in which BNNT are dispersed using electro spinning according to one embodiment of the present disclosure.
Figure 3:
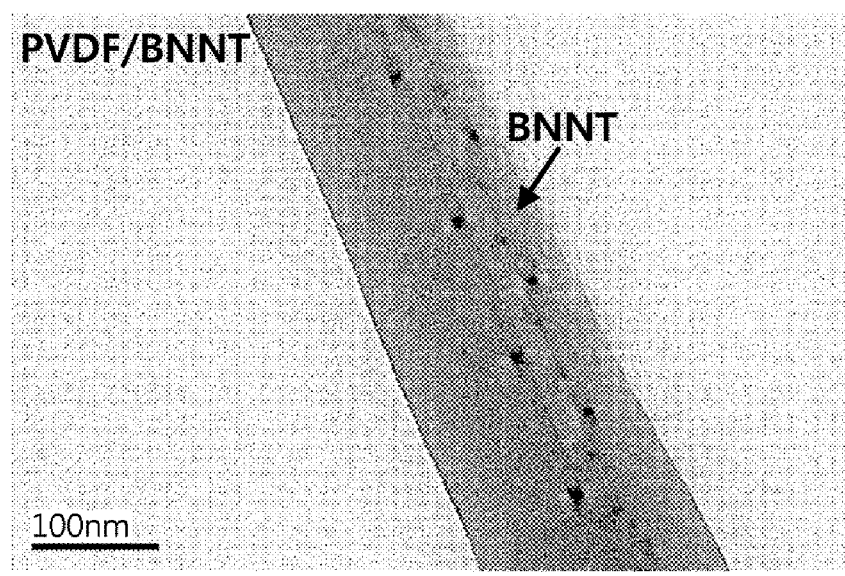
FIG. 3 illustrates an image obtained by transmission electron microscopy (TEM) of a polymeric piezoelectric composite produced by the method for producing the polymeric piezoelectric composites in FIG. 1.
Figure 4:
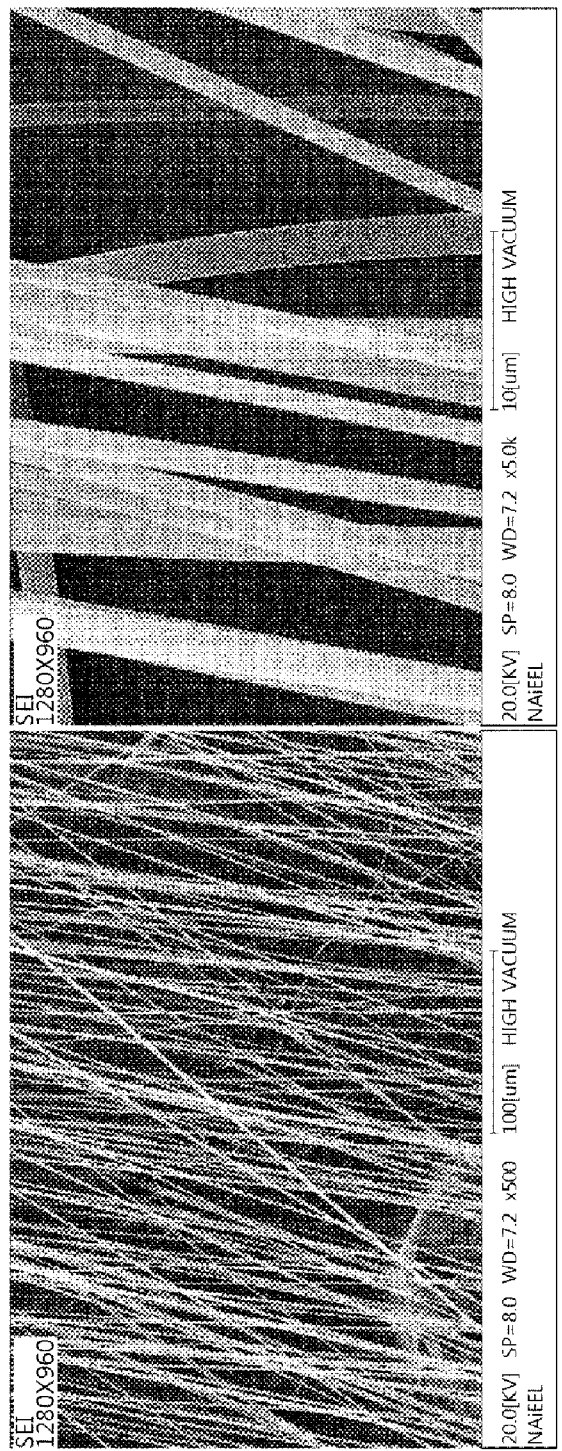
FIG. 4 illustrates an image obtained by scanning electron microscopy (SEM) of a polymeric piezoelectric composite produced by the method for producing the polymeric piezoelectric composites in FIG. 1.

FIG. 1 is a flow chart of a method for producing a polymeric piezoelectric composite with BNNT dispersed therein using electro spinning according to one embodiment of the present disclosure. FIG. 2 is a schematic diagram of a production apparatus for a polymeric piezoelectric composite in which BNNT are dispersed using electro spinning according to one embodiment of the present disclosure. FIG. 3 illustrates an image obtained by transmission electron microscopy (TEM) of a polymeric piezoelectric composite produced by the method for producing the polymeric piezoelectric composites in FIG. 1. FIG. 4 illustrates an image obtained by scanning electron microscopy (SEM) of a polymeric piezoelectric composite produced by the method for producing the polymeric piezoelectric composites in FIG. 1.

First, referring to FIG. 1, a method for producing a polymeric piezoelectric composite in which BNNT are dispersed according to one embodiment of the present disclosure may include a solution providing step S100 for providing a polymeric solution including a polymer; a dispersion step S200 for dispersing BNNT in the polymeric solution; an electro spinning step S300 of producing a polymeric piezoelectric composite of micro- and/or nano fibers by electro spinning the polymeric solution including BNNT dispersed therein; and characteristics evaluation step S400 for evaluating the piezoelectric characteristic of the polymeric piezoelectric composites.

Using the steps of the method, BNNT can be aligned in the same direction with and inside of those fibers by electro spinning without an additional and costly alignment process for polarization. Thus, the polymeric piezoelectric composites with the improved piezoelectric property can be achieved. In addition, it is possible to maximize the polarization effect by aligning (rearrangement) the constituent elements of the polymer itself.

In other words, since this method aligns BNNT included in the polymeric solution in a regular manner, it is possible to further improve the charge mobility and transfer efficiency compared to the case that BNNT are randomly distributed. In particular, the polarization of BNNT dispersed in the polymer can be maximized, thereby improving the piezoelectric characteristic of the polymeric piezoelectric composites.

Specifically, micro- and/or nano fibers as produced are stretched when the polymer solution is jetted during the electro spinning process. Thus, BNNT included in those fibers can be aligned to present the homogeneous and accurate in-line fiber arrangement.

In addition, in the polymeric piezoelectric composites of those fibers, BNNT can be aligned inside the polymer composites along with the direction of those fibers.

First, the solution providing step S100 in the present embodiment may involve dissolving a polymer in a solution prepared in advance, and providing the polymeric solution. The polymer used in the solution providing step S100 may be polyvinylidene fluoride (PVDF). The solution may be embodied as a mixture of DMA and acetone. In this solution, the polymer, that is, PVDF, may be dissolved in the amount of 10 to 30 wt %, or more preferably, 14 to 20 wt %, based on 100 wt % of the solution, to produce the polymeric solution.

However, the types and contents of polymeric solution are not limited thereto. It goes without saying that other kinds of polymers and solutions can be used and that the polymers may be mixed with the solution in the different ratios.

In one example, the dispersion step S200 in the present embodiment may involve dispersing BNNT in the polymeric solution provided by the above-mentioned solution providing step S100. That is, BNNT are homogeneously dispersed in the polymeric solution.

In the dispersing step S200, the surface treatment based on the ultrasonic excitation may be used to enhance the dispersion of BNNT in the polymeric solution.

However, the present disclosure is not limited thereto. In another example, BNNT can be evenly dispersed in the polymeric solution by using mechanical turbulence based on the agitator or mixer.

Furthermore, by way of non-limiting example, it is clear that BNNT can be evenly dispersed in the polymeric solution using any type of surface treatments. At the same time, the adhesion strength between the polymer resin and BNNT in the composites can be improved by any type of surface treatment.

In one example, the polymeric solution in which BNNT are uniformly dispersed by the dispersion step S200 is electro spun by the electro spinning step S300. Thus, the polymeric piezoelectric composite films of the micro- and/or nano fibers may be produced.

In the electro spinning step S300 of this embodiment, the polymeric solution is ejected during electro spinning such that BNNT are aligned in the same direction with and inside the micro- and/or nano fibers made of PVDF resin. Thus, the polymer films and/or sheets of the micro- and/or nano fibers can be formed.

This will be described with the reference to the production apparatus 100 of FIG. 2.

Referring to FIG. 2, the apparatus 100 for the production of the polymeric piezoelectric composites in which BNNT are dispersed in accordance with the present invention may include a solution supplier 110 for storing and supplying the polymeric solution 111 in which BNNT are dispersed; a solution ejector 120 for ejecting the polymeric solution supplied from the solution supplier 110; a collector 140 onto which the polymeric solution 111 ejected from the solution ejector 120 is collected as the polymeric piezoelectric composite films of the micro- and/or nano fibers 150; and a high-voltage power supplier 130 that applies a high voltage to the solution ejector 120 and collector 140 to allow the polymeric solution 111 to be collected onto the collector 140 via electro spinning.

When using this configuration, the polymeric solution may be electro spun from the solution ejector 120 onto the collector 140 based on electro spinning so that BNNT may be aligned in the same direction inside the polymeric solution composites.

As illustrated in FIG. 2, the solution supplier 110 may be embodied as a syringe type. Therefore, the polymeric solution can be ejected through the solution ejector 120 when the operator pushes a plunger of the solution supplier 110.

The solution ejector 120 may be embodied as a needle type coupled to a tip of the solution supplier 110. The collector 140 may be embodied as a rotatable drum type. However, the configuration of the collector 140 is not limited thereto. The collector 140 may be embodied as two drum typed rods installed in parallel.

In this connection, when high voltage from the high-voltage power supplier 130 is applied to the solution ejector 120 and the collector 140, the polymeric solution 111 ejected from the solution ejector 120 is formed into a hemispherical shape at the tip of the solution ejector 120 due to surface tension. Then, the hemispherical shape may be converted into a Taylor Cone due to mutual electrostatic repulsion between surface charges and external electric field.

Furthermore, when the electric field of a predetermined or greater intensity of electric field is applied between the solution ejector 120 and the collector 140, the polymeric solution 111 may be electro spun toward the collector 140 to form the polymeric piezoelectric composite films 150 of the micro- and nano fibers on the collector 150.

In the electro spinning step S300, the voltage applied to the polymeric solution 111 may be in a range of 5 to 30 kV. Furthermore, the ejection rate of the polymeric solution 111 may be in a range of 15 to 70 μL/min. A distance between the collector 140 onto which the polymer film is formed and the solution ejector 120 from which the polymeric solution 111 is electro spun may be adjusted between 5 cm and 20 cm. That is, the shape of the polymeric piezoelectric composite films 150 according to various characteristics of the micro- and/or nano fibers 150 may be selectively determined by adjusting the applied voltage, the injection rate, and/or the distance.

In one example, in the electro spinning step S300, micro- and/or nano fibers stretched as the polymeric solution is electro spun through the solution ejector 120. Thus, BNNT in the solution may be well-aligned in the direction of those fibers, as illustrated in FIG. 3.

In FIG. 3, in the micro- and/or nano fibers in the polymeric piezoelectric composites formed by electro spinning in accordance with this embodiment, the alignment structure of PVDF as the polymer fibers, and BNNT can be observed using transmission electron microscopy (TEM).

As illustrated in FIG. 3, BNNT are aligned uniformly along the direction of PVDF-based fibers. Therefore, this will improve the polarization efficiency compared to when the randomly distributed BNNT in PVDF occurs. Furthermore, the present embodiment may maximize the polarization due to the alignment of BNNT distributed uniformly inside the polymer, thereby improving the piezoelectric characteristic.

Additionally, polymeric piezoelectric composites with the same directionality (uniform alignment) can be produced via electro spinning of the polymeric solution. FIG. 4 illustrates an image of those fibers obtained using scanning electron microscopy (SEM). It is clear from the FIG. 4 that those fibers have the same directionality. Therefore, the polarization of BNNT may be done without any additional costly process using their alignment. Furthermore, the alignment of BNNT inside the polymer composites can maximize the charge polarization. This may improve the piezoelectric efficiency of the polymeric piezoelectric composites.

In one example, in the characteristics evaluation step S400 according to the present embodiment, the piezoelectric characteristic of the polymeric piezoelectric composites in which BNNT are aligned in the same direction by the above-described electro spinning step S300 can be evaluated using a piezometer.

In the characteristics evaluation step S400 according to the present embodiment, the piezoelectric coefficient in $d_{33}$ mode, which indicates the piezoelectric effect of the piezoelectric composites in the vertical direction of pressure and/or vibration, can be measured using the piezometer. The piezoelectric characteristics can be also evaluated depending on the concentrations of BNNT. For example, when a pure PVDF polymer without BNNT leads to the electro spun piezoelectric composite, the piezoelectric coefficient is 50 pC/N. However, the piezoelectric coefficient is 250 pC/N, when the concentration of BNNT is 2 wt %. Therefore, the piezoelectric properties of PVDF polymers with BNNT can be improved by up to five times.

These results suggest that, when PVDF mixed with BNNT is electro spun, the piezoelectric coefficient in $d_{33}$ mode is improved by about five times from 50 pC/N to 250 pC/N, whereas when PVDF alone is electro spun, the piezoelectric coefficient in $d_{33}$ mode is 50 pC/N. Thus, it can be concluded that the BNNT which are well aligned inside the polymeric piezoelectric composites and PVDF-BNNT composites produced via electro spinning thereby improve the piezoelectric characteristics.

Hereinafter, a piezoelectric sensor made of polymeric piezoelectric composite films produced based on the present embodiment will be described with the reference to the drawings.

Figure 5:
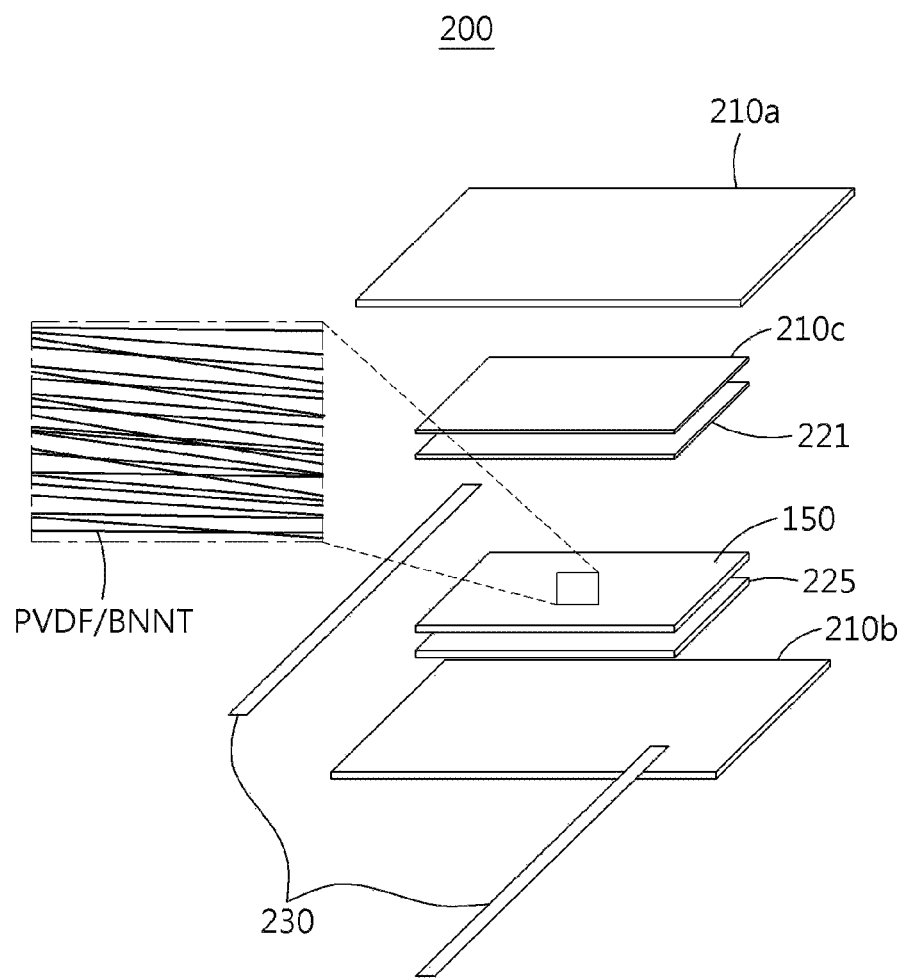
FIG. 5 illustrates the components used to fabricate a sensor for evaluating the polymeric piezoelectric composites produced by the method for producing the polymeric piezoelectric composites in FIG. 1.

FIG. 5 illustrates the components used to fabricate a sensor for evaluating the polymeric piezoelectric composite films produced by the method for producing the polymeric piezoelectric composites in FIG. 1.

Referring to FIG. 5, the configuration presents the piezoelectric sensor 200 made of the polymeric piezoelectric composites 150 produced by the above-described method. In this configuration, the piezoelectric sensor 200 is formed by stacking three polyimide films 210*a*, 210*b*, and 210*c*. A platinum (Pt) electrode 221 and an aluminum (Al) electrode 225 are also provided therebetween. The polymeric piezoelectric composite 150 in accordance with the present invention may be provided between the platinum (Pt) electrode 221 and aluminum (Al) electrode 225. Then, a copper (Cu) tape 230 may be disposed between the upper polyimide film 210*a* and the lower polyimide film 210*b* to complete the piezoelectric sensor 200.

This piezoelectric sensor 200 used the polymeric piezoelectric composite 150 containing well-aligned BNNT, and thus is designed to maximize the piezoelectric characteristic. In addition, the polyimide films 210*a*, 210*b*, and 210*c* may be used to define a front surface and a back surface of the piezoelectric sensor 200 to improve the durability and maintain the flexibility thereof.

In addition, the platinum electrode 221 and the aluminum electrode 225 are used as the upper and lower electrodes respectively for transferring the signals (electrons and charges) from the polymeric piezoelectric composite 150. The copper tape 230 may be used as a wire.

Figure 6:
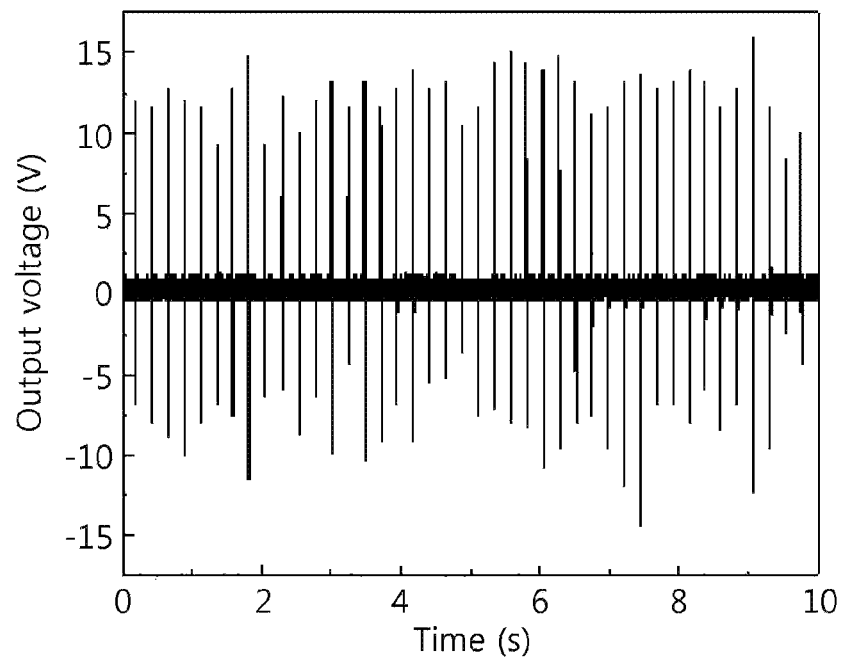
FIG. 6 illustrates an example of the voltage signals generated on the oscilloscope after fabricating the sensor of FIG. 5 based on the polymeric piezoelectric composites produced by the method illustrated in FIG. 1.

FIG. 6 illustrates an example of the voltage signals generated in the oscilloscope based on the stimulation applied to the sensor of FIG. 5 made of the polymeric piezoelectric composite produced by the method illustrated in FIG. 1.

In other words, FIG. 6 illustrates the signal measurements of the output voltage of the piezoelectric sensor.

When a constant force in a vertical direction is applied to the above-mentioned piezoelectric sensor 200, the signal resulting from the piezoelectric effect reaches up to 28 Vpp (peak-to-peak). This demonstrates the efficient performance of the polymeric piezoelectric composite in accordance with this embodiment. This piezoelectric characteristic may occur because BNNT are well aligned in PVDF fibers produced by electro spinning, and because the composite is flexible to maximize the applied vibrational mode on to the sensor.

The improved piezoelectric characteristic may be attributed partly due to increase in the β-phase content in PVDF resin caused by electro spinning, and more importantly due to higher piezoelectric characteristic of the BNNT containing electro spun sample caused by the piezoelectric property of well-aligned BNNT. This is exhibited in FIG. 7.

Figure 7A:
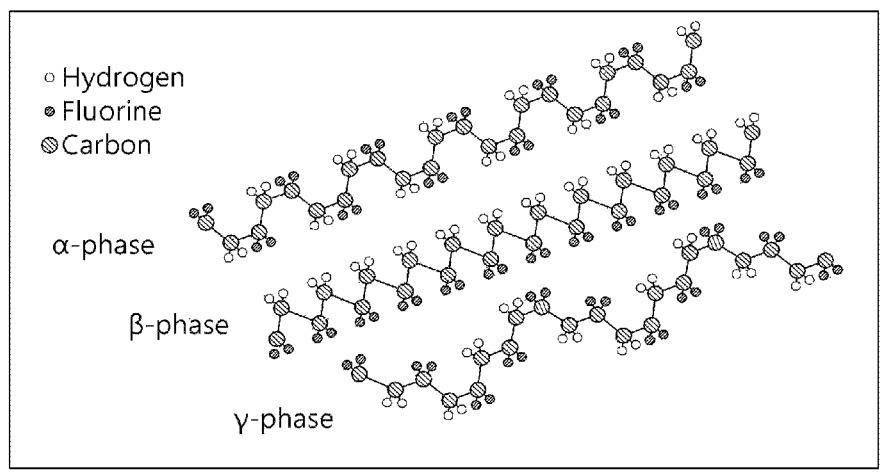
FIG. 7A illustrates the structural images of α-phase, n-phase and γ-phase based on an arrangement of the constituent elements of PVDF used in the polymeric piezoelectric composites.
Figure 7B:
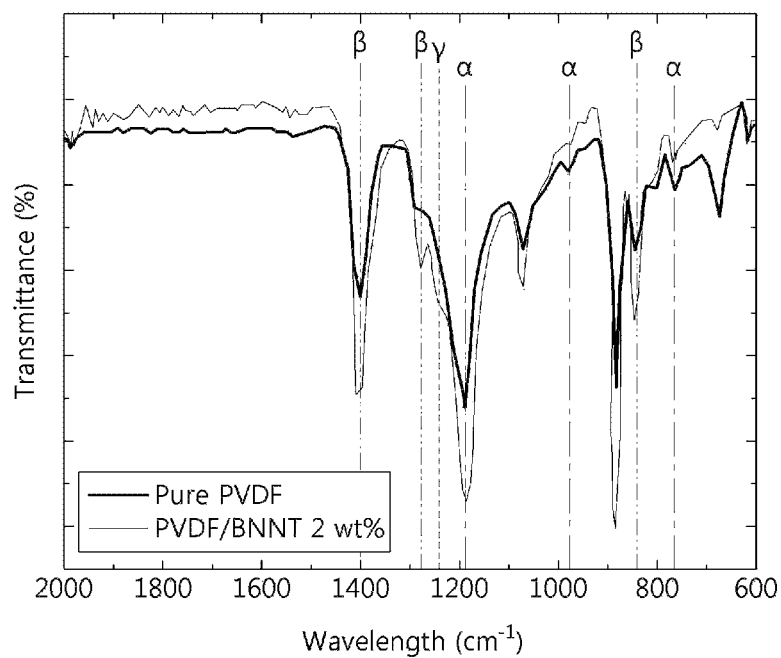
FIG. 7B illustrates Fourier transform infrared spectroscopy (FTIR) spectrum of a polymeric piezoelectric composite film produced by the electro spinning process.
Figure 7C:
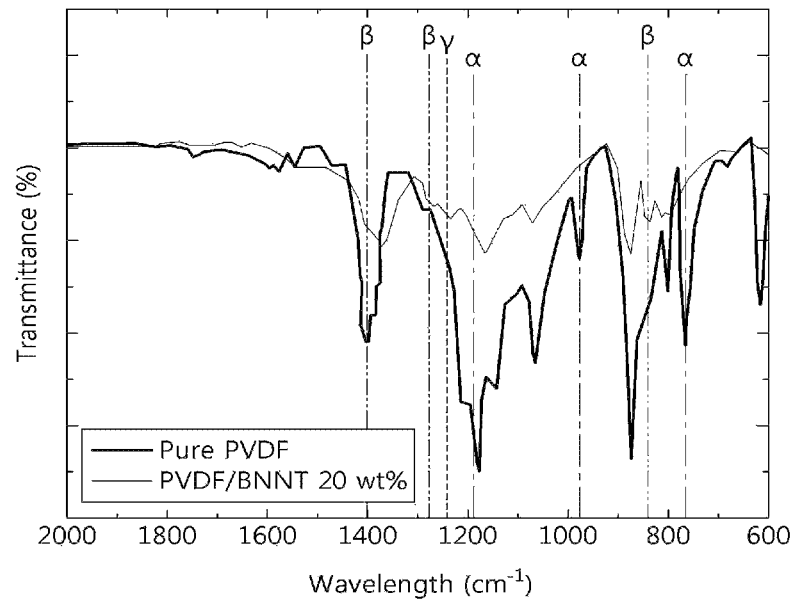
FIG. 7C illustrates FTIR spectrum of a polyvinylidenefluoride (PVDF)-based piezo electric composite fabricated by a casting method for alignment of BNNT using general mechanical shear force.
Figure 7D:
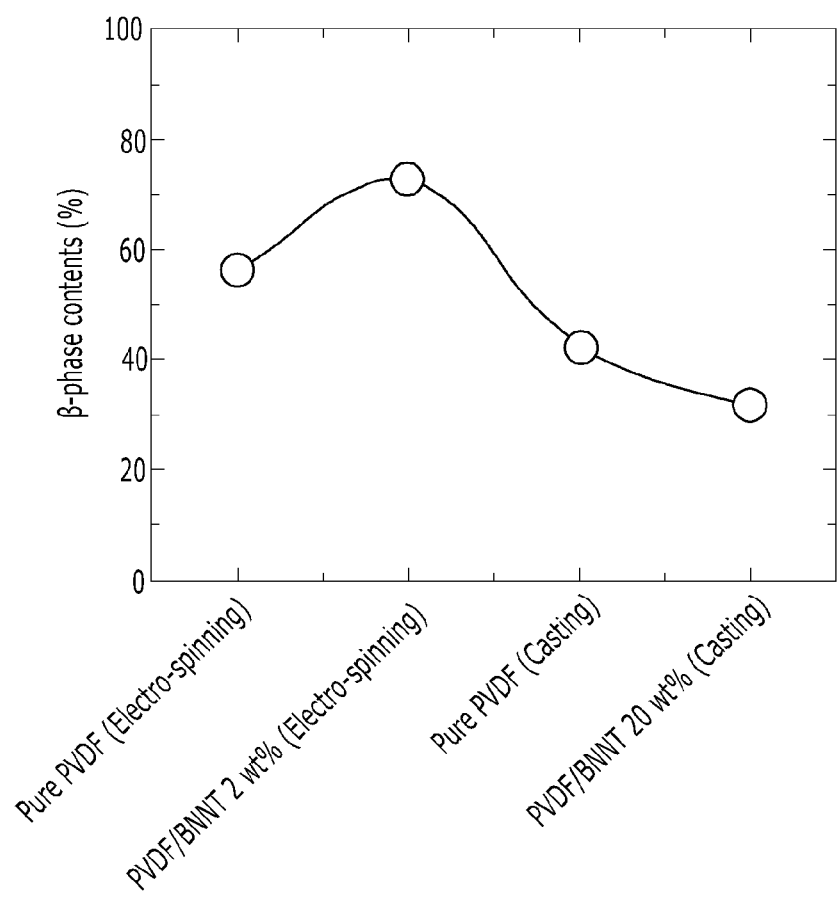
FIG. 7D illustrates the calculated composition ratios of α-phase and n-phase in each produced polymeric piezoelectric composite based on the peaks of the FTIR spectrum.

FIG. 7A illustrates the structural images of α-phase, β-phase and γ-phase of PVDF showing the arrangement of its constituent elements. FIG. 7B illustrates the FTIR spectrum of a polymeric piezoelectric composite produced by electro spinning. FIG. 7C illustrates FTIR spectrum of a PVDF-based piezo electric composite fabricated by a casting method for aligning BNNT which uses mechanical shear force. FIG. 7D illustrates the calculated composition ratio of α-phase and β-phase in each produced polymeric piezoelectric composite using the peaks of the FTIR spectrum.

In FIG. 7A, the α-phase PVDF is known to have low piezoelectricity, while the β-phase PVDF is known to have excellent piezoelectric property. In general, the α-phase PVDF should be converted to the β-phase PVDF to increase the piezoelectric effect using a polarization (rearrangement of the elements) process because of this reason.

FIGS. 7B and 7C illustrate FTIR spectrum of the polymeric piezoelectric composites produced by electro spinning in accordance with the present embodiment and by the conventional casting method, respectively.

As illustrated in FIG. 7D, it can be assumed that the β-phase content of PVDF polymer is 40% when the polymeric piezoelectric composite is produced by the conventional casting method, whereas the β-phase content of PVDF polymer increases to 55% when the polymeric piezoelectric composite is produced by the present electro spinning. Interestingly, in the polyvinylidene fluoride/boron nitride nano tubes (PVDF/BNNT20 wt %) composite as produced by the casting method, the β-phase content is lowered to about 30% compared to that of the pure PVDF polymer. This may be due to the disordered distribution of BNNT inside the polymer composite.

On the contrary, the PVDF/BNNT with 2 wt % as produced by electro spinning is to increase the β-phase content to about 75%. Thus, it is expected that BNNT are dispersed in the same direction with and inside the polymer fibers to assist the conversion of the polymer structure into the β-phase, when the polymeric piezoelectric composite is produced by the present electro spinning, The piezoelectric coefficients in $d_{33}$ mode for the polymeric composite as produced by the casting method is 5 pC/N for the pure PVDF polymer and is 40 pC/N for 20 wt % PVDF/BNNT, respectively. When the above values are compared with the piezoelectric coefficient of 250 pC/N for the polymeric piezoelectric composite of PVDF/BNNT with 2 wt % as produced by electro spinning, the latter may be as much as six times higher than that of the former. This may be considered as an indication for the improvement of piezoelectricity due to the increase in the n-phase content of PVDF as mentioned above, and the maximization of the polarization effect due to the well-alignment of BNNT.

Therefore, when the polymeric piezoelectric composite is produced by the present electro spinning, it is possible to maximize the charge transfer effect by increasing the β phase content of pure PVDF and also by aligning BNNT in PVDF, thereby resulting an increase in the piezoelectric characteristic. These results are listed in the following table.

TABLE 1

| Example | Comparative Example 1 | Comparative Example 2 | Comparative Example 3 | Present Example |
|---|---|---|---|---|
| Sample type | Pure PVDF | PVDF/BNNT 20 wt % | Pure PVDF | PVDF/BNNT 2 wt % |
| Production type | Casting | Casting | Electro spinning | Electro spinning |
| Piezoelectric coefficient (d33) | 5 | 40 | 50 | 250 |

Thus, according to an embodiment of the present disclosure, BNNT can be aligned in the same direction with and inside the micro- and/or nano fibers by electro spinning without any costly alignment process for polarization. It is clear that this embodiment will enhance the polarization effect of BNNT dispersed polymer composites. As a result, it is possible to develop the very efficient manufacturing process for the polymeric piezoelectric composites with improved piezoelectric characteristic. In addition, it also offers the uniform alignment of BNNT in the polymeric solution so that may lead to the improvement of the polarization efficiency compared to when the BNNT are randomly distributed in the polymer.

In other words, the micro- and/or nano fibers are produced by the electromagnetic field generated by applying a voltage during electro spinning, and BNNT can be aligned in the same direction with and inside of those fibers upon spinning operation. Furthermore, the polarization of the polymer itself can be also achieved depending on the kind of polymer by electro spinning. Thus, the polarization effect of the polymer composites can be enhanced, thereby implementing improved piezoelectric property.

Furthermore, BNNT are well-aligned in uniform direction in those polymer fibers such that the piezoelectric effect is maximized, and the piezoelectric effect may be further enhanced due to the polarization effect (rearrangement of the constituent elements) of the polymer itself.

Ultimately, according to an embodiment of the present disclosure, the polymeric piezoelectric composites can be produced by dispersing and aligning BNNT in the polymer resins such that the polymeric piezoelectric composites may be flexible and have high piezoelectric coefficients.

Although having described specific embodiments of the present disclosure, it is understood that various modifications are possible without departing from the scope of the present disclosure. Therefore, the scope of the present disclosure should not be limited to the embodiments as described and should be determined by the appended claims and equivalents to the scope of the appended claims.

Although the present disclosure has been described by way of limited embodiments and drawings, the present disclosure is not limited to the above embodiments. Various modifications and variations may be made thereto by those skilled in the art to which the present disclosure belongs. Accordingly, the scope of the present disclosure is to be understood only in accordance with the claims set forth below. All of the equivalents to the claims will belong to the category of the present disclosure.

What is claimed:

1. A polymeric piezoelectric composite including boron nitride nanotubes (BNNTs) dispersed therein,
   wherein the polymeric piezoelectric composite is produced by dispersing BNNTs in a polymeric solution including a polyvinylidene fluoride (PVDF) as a polymer dissolved therein, and the polymeric solution including BNNTs dispersed therein forms PVDF-based micro- and/or nano fibers so that BNNTs are uniformly aligned with and in the same direction with and inside the PVDF-based micro- and/or nano fibers in the piezoelectric polymer composite to improve polarization efficiency, wherein the step of electro spinning is performed such that BNNTs are dispersed in the polymeric solution at a concentration of 0.01 wt % to 20 wt %.

* * * * *